(12) United States Patent
Sugawara et al.

(10) Patent No.: US 11,037,763 B2
(45) Date of Patent: Jun. 15, 2021

(54) MEMBER AND PLASMA PROCESSING APPARATUS

(71) Applicant: Tokyo Electron Limited, Tokyo (JP)

(72) Inventors: Yuki Sugawara, Miyagi (JP); Masanori Asahara, Miyagi (JP); Masafumi Urakawa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 197 days.

(21) Appl. No.: 15/989,324

(22) Filed: May 25, 2018

(65) Prior Publication Data
US 2018/0350567 A1    Dec. 6, 2018

(30) Foreign Application Priority Data

Jun. 2, 2017  (JP) .............................. JP2017-109968

(51) Int. Cl.
*H01J 37/32* (2006.01)

(52) U.S. Cl.
CPC ........ *H01J 37/32651* (2013.01); *H01J 37/32* (2013.01); *H01J 37/32477* (2013.01); *H01J 37/32642* (2013.01)

(58) Field of Classification Search
None
See application file for complete search history.

(56) References Cited

U.S. PATENT DOCUMENTS

| 4,519,840 | A  | * | 5/1985  | Jackson | ................. | C22C 29/08 |
|---|---|---|---|---|---|---|
|  |  |  |  |  |  | 106/1.05 |
| 2007/0248832 | A1 | * | 10/2007 | Maeda | ..................... | C23C 4/06 |
|  |  |  |  |  |  | 428/457 |
| 2008/0236744 | A1 | * | 10/2008 | Furuse | ............. | H01J 37/32623 |
|  |  |  |  |  |  | 156/345.1 |
| 2009/0151870 | A1 | * | 6/2009 | Urakawa | .......... | H01J 37/32623 |
|  |  |  |  |  |  | 156/345.1 |
| 2012/0214313 | A1 | * | 8/2012 | Ooya | ................ | H01J 37/32165 |
|  |  |  |  |  |  | 438/712 |

FOREIGN PATENT DOCUMENTS

JP    2014-225501    12/2014

* cited by examiner

*Primary Examiner* — Jethro M. Pence
(74) *Attorney, Agent, or Firm* — IPUSA, PLLC

(57) ABSTRACT

There is provision of a member used in a plasma processing apparatus configured to generate plasma from a gas in a processing vessel and to process a substrate disposed on a mounting base in the processing vessel using the plasma. The member includes a surface exposed to the plasma in the processing vessel in a state installed in the processing vessel, and a coating layer including cobalt which covers a part of the surface.

12 Claims, 6 Drawing Sheets

| Co coating |  |  |  |
|---|---|---|---|
| Area Ratio | 100% | 6.2% | 0.10% |
| Co Contamination [atoms/cm²] | 1.89 | 0.04 | Less than 0.002 |
| ER Shift Amount (after RF 50h) | ▲22% | ▲10% | ▲4% |

MEMBER AND PLASMA PROCESSING APPARATUS

CROSS-REFERENCE TO RELATED APPLICATIONS

This patent application is based upon and claims the benefit of priority of Japanese Patent Application No. 2017-109968 filed on Jun. 2, 2017, the entire contents of which are incorporated herein by reference.

BACKGROUND OF THE INVENTION

1. Field of the Invention

The present invention generally relates to a member and a plasma processing apparatus.

2. Description of the Related Art

A plasma processing apparatus is known, which causes gas to become plasma in a processing vessel and processes a substrate disposed on a mounting base using the plasma (see Patent Document 1 for example). In the plasma processing apparatus, a gas shower head is mounted to an opening of a ceiling through a shield ring.

When a new plasma processing apparatus is supplied, or when a replaceable part of a plasma processing apparatus that is installed inside a processing vessel is replaced with a new part, in order that process characteristics with respect to plasma treatment do not vary, after making a condition inside the processing vessel adequate by performing seasoning of the inside of the processing vessel, treatment of a wafer is performed.

However, in the above method, seasoning, which requires a long time, must be performed every time a new plasma processing apparatus is supplied or a part is replaced. Accordingly, throughput decreases, and productivity deteriorates.

[Patent Document 1] Japanese Laid-open Patent Application Publication No. 2014-225501

SUMMARY OF THE INVENTION

In one aspect, the present invention aims at obtaining stable process characteristics in a plasma treatment while reducing a time for seasoning.

To solve the above problem, according to an aspect of the present invention, there is provision of a member used in a plasma processing apparatus configured to generate plasma from a gas in a processing vessel and to process a substrate disposed on a mounting base in the processing vessel using the plasma. The member includes a surface exposed to the plasma in the processing vessel in a state installed in the processing vessel, and a coating layer including cobalt which covers a part of the surface.

DETAILED DESCRIPTION OF EMBODIMENTS

In the following, embodiments of the present invention will be described with reference to the drawings. Note that in the following descriptions and the drawings, elements having substantially identical features are given the same reference symbols and overlapping descriptions may be omitted.

[Plasma Processing Apparatus]

Figure 1:
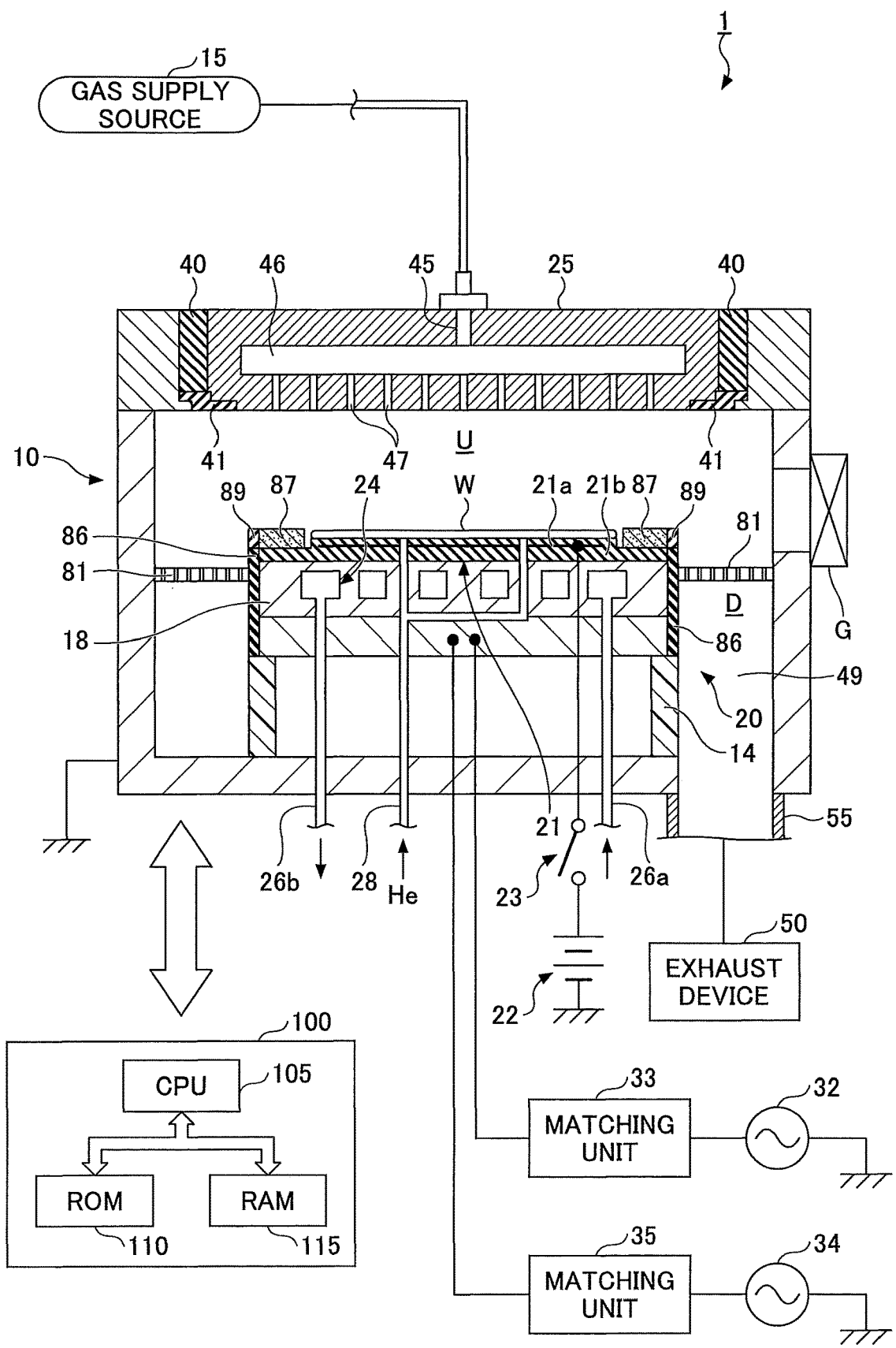
FIG. 1 is a view illustrating an example of a plasma processing apparatus according to an embodiment.

First, an example of a plasma processing apparatus 1 will be described with reference to FIG. 1. The plasma processing apparatus 1 according to an embodiment of the present invention is a CCP (Capacitively Coupled Plasma) type parallel-flat plate plasma processing apparatus, and is an example of a plasma processing apparatus which causes gas to become plasma in a processing vessel 10 and processes a wafer W disposed on a mounting base 20 utilizing plasma effect.

The plasma processing apparatus 1 includes the substantially cylindrical processing vessel 10. To an internal surface of the processing vessel 10, anodic oxidation treatment is applied. An inside of the processing vessel 10 is a processing chamber for performing plasma treatment such as etching or depositing.

The mounting base 20 includes a base 18, and is used for placing a semiconductor wafer (hereinafter, it will be denoted as "wafer W") which is an example of a substrate. The mounting base 20 is formed of, for example, aluminum (Al), titanium (Ti), or silicon carbide (SiC). The mounting base 20 also acts as a lower electrode (bottom electrode).

An electrostatic chuck 21 for attracting the wafer W electrostatically is disposed on the mounting base 20. The electrostatic chuck 21 is configured such that a chuck electrode 21a is embedded in an insulating member 21b. A direct current power source (DC power source) 22 is connected to the chuck electrode 21a via a switch 23. When the switch 23 is turned on, DC voltage is applied from the DC power source 22 to the chuck electrode 21a and the wafer W is attracted to the electrostatic chuck 21 by the Coulomb force.

On a periphery of the upper surface of the electrostatic chuck 21, an annular focus ring 87 is disposed so as to surround an outer edge of the wafer W. The focus ring 87 is formed of silicon, for example, and improves efficiency of plasma treatment by making plasma converge on a surface of the wafer W.

The mounting base 20 is fixed at a bottom of the processing vessel 10 via a supporting member 14. Inside the base 18, a coolant passage 24 is formed. Coolant such as water or brine that is output from a chiller flows from a coolant inlet pipe 26a to a coolant outlet pipe 26b through the coolant passage 24 and circulates. By the circulating coolant, heat is released and the mounting base 20 is cooled.

Heat transmitting gas such as helium gas (He) or argon gas (Ar), which is supplied from a heat transmitting gas supply source, is supplied, through a gas supply line 28, to the back surface of the wafer W disposed on the electrostatic chuck 21. Accordingly, temperature of the wafer W is maintained in a predetermined temperature by the coolant circulating in the coolant passage 24 and the heat transmitting gas supplied to the back surface of the wafer W.

A first high frequency power source 32 is electrically connected to the mounting base 20 via a first matching unit 33, and applies high frequency electric power HF of a first frequency (40 MHz for example) for generating plasma to the mounting base 20. A second high frequency power source 34 is electrically connected to the mounting base 20 via a second matching unit 35, and applies high frequency electric power LF of a second frequency (13.56 MHz for example) less than the first frequency to the mounting base 20, for generating bias voltage (hereinafter, the high frequency electric power HF of the first frequency may be referred to as "first high frequency power", and the high frequency electric power LF of the second frequency may be referred to as "second high frequency power"). Though the high frequency electric power HF for generating plasma is applied to the mounting base in the present embodiment, the high frequency electric power HF may be applied to a gas shower head 25.

The first matching unit 33 is for matching an internal impedance (or output impedance) of the first high frequency power source 32 and a load impedance. The second matching unit 35 is for matching an internal impedance (or output impedance) of the second high frequency power source 34 and a load impedance.

The gas shower head 25 is mounted to an opening of a ceiling of the processing vessel 10 through a cylindrical shield ring 40 provided at an outer edge of the gas shower head 25, such that the opening is closed with the gas shower head 25. The gas shower head 25 may be formed of silicon. The gas shower head 25 also acts as an opposing electrode (upper electrode) facing the mounting base 20 (lower electrode). In the vicinity of the circumference of the gas shower head 25, a top shield ring 41 made of quartz ($SiO_2$) is provided on a lower surface of the shield ring 40.

A gas inlet 45 for introducing gas is formed at the gas shower head 25. Inside the gas shower head 25, a diffusion chamber 46 is provided. When gas is output from a gas supply source 15, the gas is supplied to the diffusion chamber 46 via the gas inlet 45 and diffuses in the diffusion chamber 46. Then the gas is introduced to a plasma treatment space U in the processing vessel 10 from the large number of the gas holes 47.

At a bottom of the processing vessel 10, an exhaust port 55 is formed. Gas in the processing vessel 10 is discharged by an exhaust device 50 connected to the exhaust port 55. According to the structure of the processing vessel 10, the inside of the processing vessel 10 can be kept in a desirable quality of vacuum. At a side wall of the processing vessel 10, the gate valve G is provided. Opening and closing of the gate valve G is performed when the wafer W is loaded into the processing vessel 10 or unloaded from the processing vessel 10.

An annular baffle plate 81 is disposed at an upper part (or an entrance) of an exhaust passage 49 formed above the exhaust port 55. The baffle plate 81 separates the plasma treatment space U and an exhaust space D and regulates a flow of gas.

A quartz part 86 is provided so as to cover a side wall of the mounting base 20. The quartz part 86 is cylindrical, and is formed of quartz. A cover ring 89 made of quartz is provided at an outer circumference of the focus ring 87.

A controller 100 is provided to the plasma processing apparatus 1. The controller 100 includes a CPU 105, a ROM (Read Only Memory) 110, and a RAM (Random Access Memory) 115. The CPU 105 executes a desired plasma treatment such as etching, in accordance with a recipe stored in a memory region such as the RAM 115. The recipe includes control information of the apparatus corresponding to a process condition, such as a time required for the process, a pressure (of exhaust gas), power or voltage of the high frequency power source, an amount of flow of each gas, a temperature inside the processing vessel (such as a temperature of the upper electrode, a temperature of an inner wall of the processing vessel, a temperature of the wafer W, and a temperature of the electrostatic chuck), and a temperature of coolant. Such a recipe indicating a process or a program may be stored in a hard disk drive or a semiconductor memory. Alternatively, the recipe may be stored in a removable storage medium such as a CD-ROM or a DVD, and be loaded in a predetermined place in an accessible state.

When plasma treatment is applied to the wafer W, opening and closing of the gate valve G is controlled, and the wafer W is loaded into the processing vessel 10 and placed on the mounting base 20. When DC voltage is applied from the DC power source 22 to the chuck electrode 21*a*, the wafer W is attracted and held to the electrostatic chuck 21.

Treatment gas is introduced into the processing vessel 10 from the gas supply source 15. The first high frequency power is applied to the mounting base 20 from the first high frequency power source 32, and the second high frequency power is applied to the mounting base 20 from the second high frequency power source 34. As a result, plasma is generated in the plasma treatment space U above the wafer W, and plasma treatment is applied to the wafer W by an effect of the plasma.

After plasma treatment, DC voltage having an opposite polarity to the polarity when the wafer W is attracted is applied from the DC power source 22 to the chuck electrode 21*a*, to remove electrical charge of the wafer W. As a result, the wafer W can be removed from the electrostatic chuck 21, and is unloaded from the gate valve G to an outside of the processing vessel 10.

[Top Shield Ring]

Figure 2:
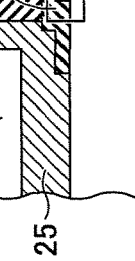
FIG. 2 illustrates experimental results with respect to process characteristics when using a top shield ring according to the present embodiment coated with a cobalt coating layer.
Figure 2:
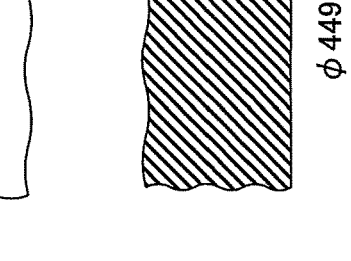
Figure 2:
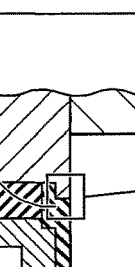

Next, an example of a structure of the top shield ring 41 according to the present embodiment, which is used for the above described plasma processing apparatus 1, will be described with reference to FIG. 2. FIG. 2 illustrates experimental results with respect to process characteristics when using the top shield ring 41 according to the present embodiment coated with cobalt (Co) on a surface.

The top shield ring 41 according to the present embodiment is a member used in the processing vessel 10 of the plasma processing apparatus 1, and is an example of a member coated with a coating layer 42 including cobalt (Co) on a part of the surface. In the present embodiment, the coating layer 42 consists of only cobalt, and is formed by thermal spraying of cobalt. However, the coating layer 42 may be formed by spraying a material including cobalt. For example, the coating layer 42 may be formed by spraying a material including cobalt and carbon (C). Further, a method of forming the coating layer 42 is not necessarily limited to the thermal spraying. An example of another method of forming the coating layer 42 includes a method using CVD (Chemical Vapor Deposition) or PVD (Physical Vapor Deposition).

The top shield ring 41 is provided in vicinity of an outer circumference of the gas shower head 25 (upper electrode), and is an example of a first ring-shaped member coated with a coating layer of cobalt on a part of a surface (or with a coating layer including cobalt on a part of a surface).

In the present embodiment, with respect to the surface of the top shield ring 41, at least a part of a side is coated with a coating layer 42 of cobalt. Specifically, at least a part of a side of a lower step of steps of the top shield ring 41 is coated with cobalt. The side of the lower step of the steps of the top shield ring 41 is adjacent to the plasma treatment space U, and there is a gap near the side where plasma in the processing vessel 10 can enter. That is, with respect to surfaces of the top shield ring 41, the side of the lower step of the steps of the top shield ring 41 is a surface exposed to plasma in the processing vessel 10. Therefore, during plasma treatment, the side of the lower step of the steps of the top shield ring 41 is exposed to plasma, and a temperature of the side of the lower step of the steps of the top shield ring 41 becomes high because of heat from plasma.

When a new plasma processing apparatus 1 has been supplied, or when a replaceable part in the processing vessel 10 has been replaced with a new one, in order that process characteristics do not vary, after making a condition inside the processing vessel adequate by performing seasoning of the inside of the processing vessel, treatment of a wafer is performed. However, in such a method, seasoning, which is performed when a new plasma processing apparatus is supplied or a part is replaced, requires a long time. Accordingly, throughput decreases, and productivity deteriorates.

Because cobalt becomes a contamination source in wafer treatment, cobalt should not exist in the processing vessel 10. However, as cobalt is discharged from a wafer during plasma treatment, an amount of cobalt deposited on members in the processing vessel 10 gradually increases. Therefore, under a practical environment, it is impossible to completely eliminate cobalt from the processing vessel 10. Because of the above reason, a process using the plasma processing apparatus 1 is performed on the premise that an etching rate (hereinafter denoted as "ER"), as attained when using a processing vessel 10 in which a certain amount of cobalt is present, is one of the process characteristics in an "initial state" of the processing vessel 10.

When a new plasma processing apparatus 1 is used, or when a part is replaced, seasoning must be applied to the new plasma processing apparatus 1 in which cobalt is not present, until an ER attained by a processing vessel 10 of the new plasma processing apparatus 1 is reduced to a level as attained by the processing vessel 10 in the initial state (in which a certain amount of cobalt is present in the processing vessel 10), which takes a long time.

To avoid the above problem, in the present embodiment, coating of cobalt is applied in advance to a replaceable part in the processing vessel 10. The coating in advance can reduce a shift of process characteristics that occurs when a new plasma processing apparatus 1 is used or when a part is replaced with a new one, and can make time required for seasoning shorter. Accordingly, throughput improves, and productivity also improves.

However, in order for coating of cobalt applied to the top shield ring 41 to not become a contamination source in the processing vessel 10, a location and a size of a region on the top shield ring 41, which is coated with cobalt, need to be optimized.

Therefore, the inventors performed experiments to optimize a location and a size of a region to be coated with cobalt on the top shield ring 41, in order to reduce a shift of process characteristics and in order that coating of cobalt does not become a contamination source of plasma treatment.

Each diagram in a rightmost column, a second column from the right, and a third column in FIG. 2 illustrates a cross section of a part of the bottom surface and the side of the lower step of the steps of the top shield ring 41 that are coated with a coating layer 42 of cobalt.

In the diagram illustrated in the third column from the right in FIG. 2, an entire bottom surface 42a of the top shield ring 41, an entire surface of an outer side 42b of the lower step of the steps of the top shield ring 41, an entire surface of an inner side 42c of the lower step of the steps of the top shield ring 41, and a part of an upper surface 42d of the lower step of the steps of the top shield ring 41 which is close to the inner side 42c, are coated with a coating layer 42 of cobalt. A second row of each column in FIG. 2 represents a ratio (expressed as a percentage) of a region coated with a coating layer 42 of cobalt (hereinafter, the ratio will be referred to as an "area ratio"), based on the coated area of the diagram illustrated in the third column from the right in FIG. 2 being taken as 100%. Note that a radial distance of the inner side 42c of the lower step of the steps of the top shield ring 41 from a center axis of the mounting base 20 is 365 mm.

In a case in which the top shield ring 41 illustrated in the third column from the right in FIG. 2 is used, a cobalt contamination amount by the coating layer 42 was 1.89 (atoms/cm$^2$), and an ER shift amount, in a case in which the first high frequency power has been applied for 50 hours, decreases by 22% as compared to a case in which the top shield ring 41 not coated with a coating layer 42 of cobalt is used.

In the diagram illustrated in the second column from the right in FIG. 2, a part of the bottom surface 42a of the top shield ring 41, specifically an outer region 42a1 of the bottom surface 42a is coated with a coating layer 42 of cobalt. Also, a substantially entire surface of an outer side 42b1 of the lower step of the steps of the top shield ring 41 is coated with a coating layer 42 of cobalt. An area ratio of the coated area of the diagram illustrated in the second column from the right in FIG. 2 is 6.2%, which corresponds to approximately 1/20 of the diagram illustrated in the third column from the right in FIG. 2. Note that a radial distance of an inner end of the outer region 42a1 from a center axis of the mounting base 20 is 442 mm.

In a case in which the top shield ring 41 illustrated in the second column from the right in FIG. 2 is used, a cobalt contamination amount by the coating layer 42 was 0.04 (atoms/cm$^2$). That is, the cobalt contamination amount decreased to 1/50 as compared to a case in which the top shield ring 41 illustrated in the third column from the right in FIG. 2 is used (1.89 (atoms/cm$^2$)).

Further, in a case in which the top shield ring 41 illustrated in the second column from the right in FIG. 2 is used, an ER shift amount in a case in which the first high frequency power has been applied for 50 hours decreased by 10% as compared to a case in which the top shield ring 41 not coated with a coating layer 42 of cobalt is used. The ER shift amount in this case also decreases to approximately 1/2 as compared to a case in which the top shield ring 41 illustrated in the third column from the right in FIG. 2 is used.

In the diagram illustrated in the rightmost column in FIG. 2, a part of the surface 42b2 of the outer side 42b of the lower step of the steps of the top shield ring 41 is coated with a coating layer 42 of cobalt. An area ratio of the coated area of the diagram illustrated in the rightmost column in FIG. 2 is 0.1%, which corresponds to approximately 1/1000 of the diagram illustrated in the third column from the right in FIG. 2. Note that a radial distance of the part of the surface 42b2 from a center axis of the mounting base 20 is 449 mm.

In a case in which the top shield ring 41 illustrated in the rightmost column in FIG. 2 is used, a cobalt contamination amount by the coating layer 42 was less than 0.002 (atoms/cm$^2$). That is, the cobalt contamination amount decreased to approximately 1/1000 as compared to a case in which the top shield ring 41 illustrated in the third column from the right in FIG. 2 is used (1.89 (atoms/cm$^2$)).

Further, in a case in which the top shield ring 41 illustrated in the rightmost column in FIG. 2 is used, an ER shift amount in a case in which the first high frequency power has been applied for 50 hours decreased by 4% as compared to a case in which the top shield ring 41 not coated with a coating layer 42 of cobalt is used. The ER shift amount in this case also decreases to approximately 1/5 as compared to a case in which the top shield ring 41 illustrated in the third column from the right in FIG. 2 is used.

From the above experiments, it was found that, in a case in which the top shield ring 41 illustrated in the third column from the right in FIG. 2 is used, the ER excessively decreases because an amount of cobalt coated on the top shield ring 41 is large. On the other hand, in a case in which the top shield ring 41 illustrated in the second column from the right in FIG. 2 is used, a decreasing amount of the ER is 10%, which results in substantially the same rate as an ER attained when using the processing vessel 10 in the initial state. Therefore, it was found that, in a case in which the top shield ring 41 illustrated in the second column from the right in FIG. 2 is used, an amount of cobalt coated on the top shield ring 41 and the location of the coating is appropriate.

In addition, in a case in which the top shield ring 41 illustrated in the second column from the right in FIG. 2 is used, as the cobalt contamination amount is 0.04 (atoms/cm$^2$), the cobalt contamination amount is little. According to the above result, when the top shield ring 41 having a coating layer 42 as illustrated in the second column from the right in FIG. 2 is used, while an amount of cobalt adhering to the wafer W is minimized and a cobalt contamination can be reduced, a time required for seasoning is lessened because a state of the inside of the processing vessel 10 can be quickly changed, by the seasoning, into a state in which an ER similar to the initial state can be realized.

Conversely, it was found that, in a case in which the top shield ring 41 illustrated in the rightmost column in FIG. 2 is used, the ER does not appreciably decrease because an amount of cobalt coating the top shield ring 41 is little. Accordingly, although cobalt contamination can be further reduced, as it takes longer to change a state of the inside of the processing vessel 10 to the initial state by seasoning, an effect of shortening a time for seasoning is reduced.

Therefore, with respect to the top shield ring 41, if an amount of cobalt coating and the location of the coating on the top shield ring 41 are chosen as the coating layer 42 illustrated in the second column from the right in FIG. 2, a stable process characteristic can be attained in plasma treatment while shortening a time required for seasoning. Also, with respect to the coating layer 42 illustrated in the second column from the right in FIG. 2, as the outer side of the top shield ring 41 is coated with the coating layer 42, an amount of cobalt scattered on the wafer W can be reduced.

As described above, in the top shield ring 41 according to the present embodiment, a location and a size of a region to be coated with the cobalt coating layer 42 is optimized in order not to contaminate the wafer, such that an ER decreases by approximately 10% as compared to a case in which a top shield ring 41 not having the coating layer 42 is used. Accordingly, the time required for seasoning is lessened while reducing a cobalt contamination in the processing vessel 10, and a stable ER in a plasma treatment can be obtained.

In the present embodiment, a case is described in which the top shield ring 41 is coated with the cobalt coating layer 42. However, members to be coated with cobalt are not limited to the top shield ring 41. Any members may be coated with cobalt, as long as the member is disposed above the baffle plate 81 in the processing vessel 10, specifically, in the plasma treatment space U or in a space adjacent to the plasma treatment space U. That is, a member to be coated with cobalt is a part located above the baffle plate 81 in the processing vessel 10, which is exposed to a space in the plasma treatment space U or in a space adjacent to the plasma treatment space U and is heated by plasma. A member to be coated with cobalt may be an insulating member such as quartz, or a metal such as Al that forms members such as a deposhield (deposition shield).

An example of the member disposed in the processing vessel 10 in the present embodiment includes, in addition to the top shield ring 41, the quartz part 86 and the cover ring 89. The top shield ring 41, the quartz part 86, and the cover ring 89 are formed of quartz.

With respect to a region of the quartz part 86 or the cover ring 89 to be covered with the coating layer 42, it is preferable that the region is as distant from the wafer W as possible. Specifically, it is preferable that an outer side of the quartz part 86 or the cover ring 89 is coated with the coating layer 42. By coating the members as mentioned above, an amount of cobalt scattered and deposited on the wafer W can be reduced, and a cobalt contamination can be reduced.

The quartz part 86 is provided at an outer circumference of the mounting base 20, and is an example of a second ring-shaped member coated with the coating layer 42 of cobalt on a part of a surface (or with a coating layer 42 including cobalt on a part of a surface). The coating layer 42 of the quartz part 86 covers at least a part of an opposite side surface of the quartz part 86 with respect to the mounting base 20. The area of the quartz part 86 covered with the coating layer 42 can be optimized by performing an experiment measuring a cobalt contamination amount and a decreasing amount of an ER, as illustrated in FIG. 2.

The cover ring 89 is provided at an outer circumference of the focus ring 87, and is an example of a third ring-shaped member coated with the coating layer 42 of cobalt on a part of a surface (or with a coating layer 42 including cobalt on a part of a surface). The coating layer 42 of the cover ring 89 covers at least a part of an opposite side surface of the cover ring 89 with respect to the mounting base 20 (or the focus ring 87). The area of the cover ring 89 covered with the coating layer 42 can be optimized by performing an experiment measuring a cobalt contamination amount and a decreasing amount of an ER, as illustrated in FIG. 2.

[Cobalt Coating Layer]

Figure 3A:
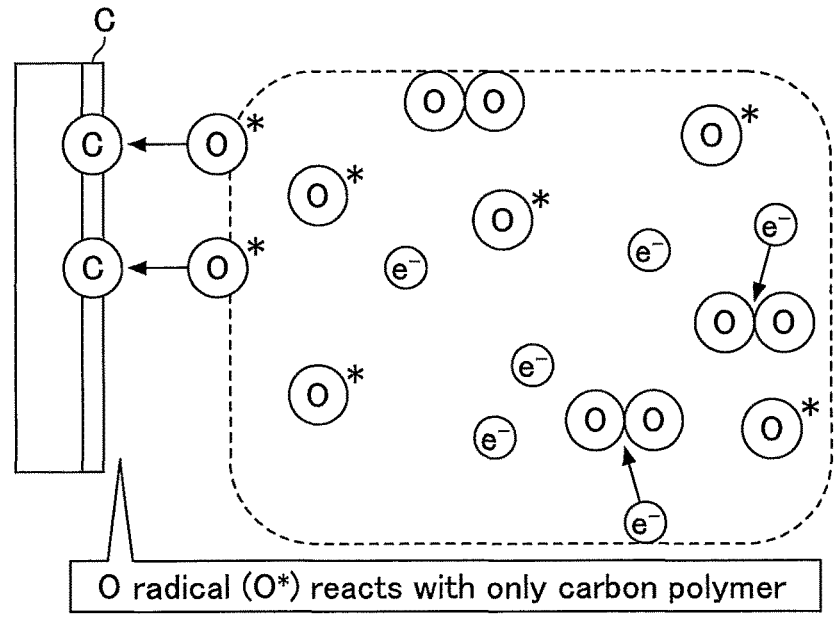
FIGS. 3A to 3C are diagrams illustrating states of a surface of a member according to the present embodiment in a case in which the member is coated with the cobalt coating layer and in a case in which the member is not coated with the cobalt coating layer.

Next, a state of a surface of a member, during plasma treatment, according to the present embodiment, such as the top shield ring 41, the quartz part 86 or the cover ring 89, will be described with reference to FIGS. 3A to 3C. In the following description, both cases in which the member is coated with the cobalt coating layer 42 and in which the member is not coated with the cobalt coating layer 42 are described. FIG. 3A is a diagram illustrating an example of a state of the surface of the member during oxygen plasma treatment when the member is not coated with the cobalt coating layer 42, and FIGS. 3B and 3C are diagrams illustrating an example of a state of the surface of the member during oxygen plasma treatment when the member is coated with the cobalt coating layer 42.

During plasma treatment such as etching, carbon is deposited on the member. When the member is not coated with the cobalt coating layer 42, oxygen radicals in the plasma react with carbon polymer (C) deposited on the member, as illustrated in FIG. 3A.

Figure 3B:
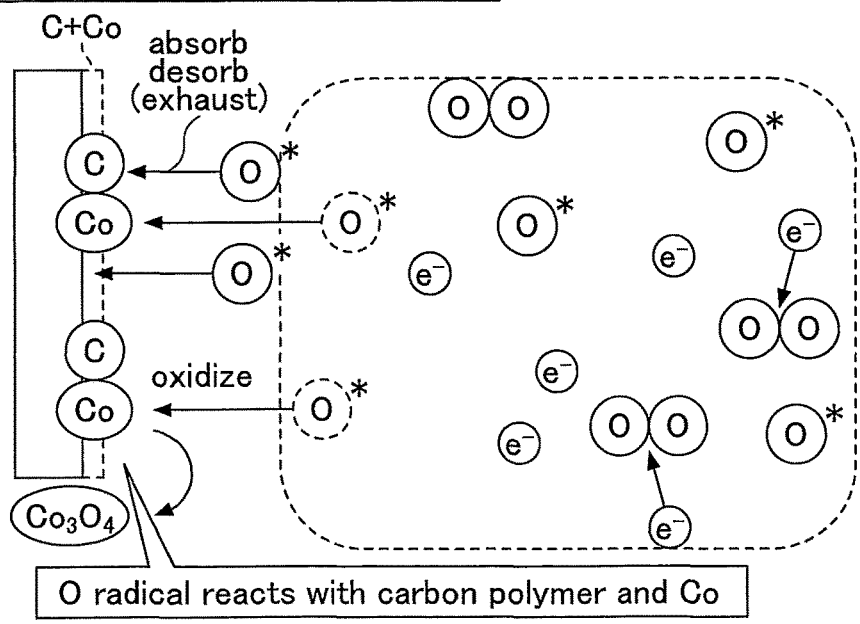
Figure 3C:
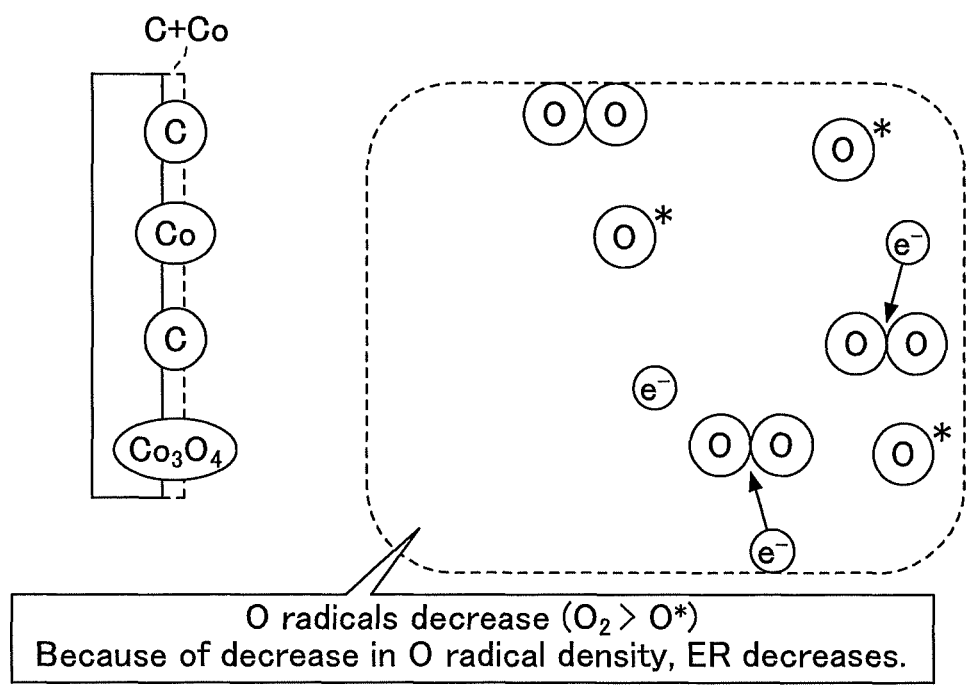

Conversely, when the member is coated with the cobalt coating layer 42, oxygen radicals in the plasma react with carbon polymer (C) having been deposited on the member and cobalt (Co), as illustrated in FIG. 3B. In a state of 300° C. or more, and when carbon and cobalt exist, as C—Co reacts with O radicals and Co is oxidized, $Co_3O_4$ is generated.

That is, O radicals in the plasma are consumed because various chemical reactions occur, such as a reaction attracted on a surface of the member ($O^* + O^* \rightarrow O_2$), a reaction such that O radicals react with C or Co and generate $Co_3O_4$. The generated $Co_3O_4$ is desorbed from the member, and exhausted out of the plasma processing apparatus 1. Therefore, as illustrated in FIG. 3C, because an O radical density in the plasma decreases, an ER in the plasma treatment decreases.

It should be noted that cobalt is an essential element for consuming O radicals, but carbon is not necessarily required for consuming O radicals. However, when carbon exists in addition to cobalt, generation of $Co_3O_4$ is promoted. Reference can be made to a thesis published on Jun. 15, 2015, titled "In situ oxidation of carbon-encapsulated cobalt nanocapsules creates highly active cobalt oxide catalysts for hydrocarbon combustion".

Carbon that is used for the above reaction may be what is deposited on the member during plasma treatment. Alternatively, when carbon is contained in the coating layer 42, the carbon contained in the coating layer 42 may be used for the above reaction. Further, instead of carbon, metals (other than cobalt) which consume oxygen in a high-temperature state may be used with cobalt.

Figure 4A:
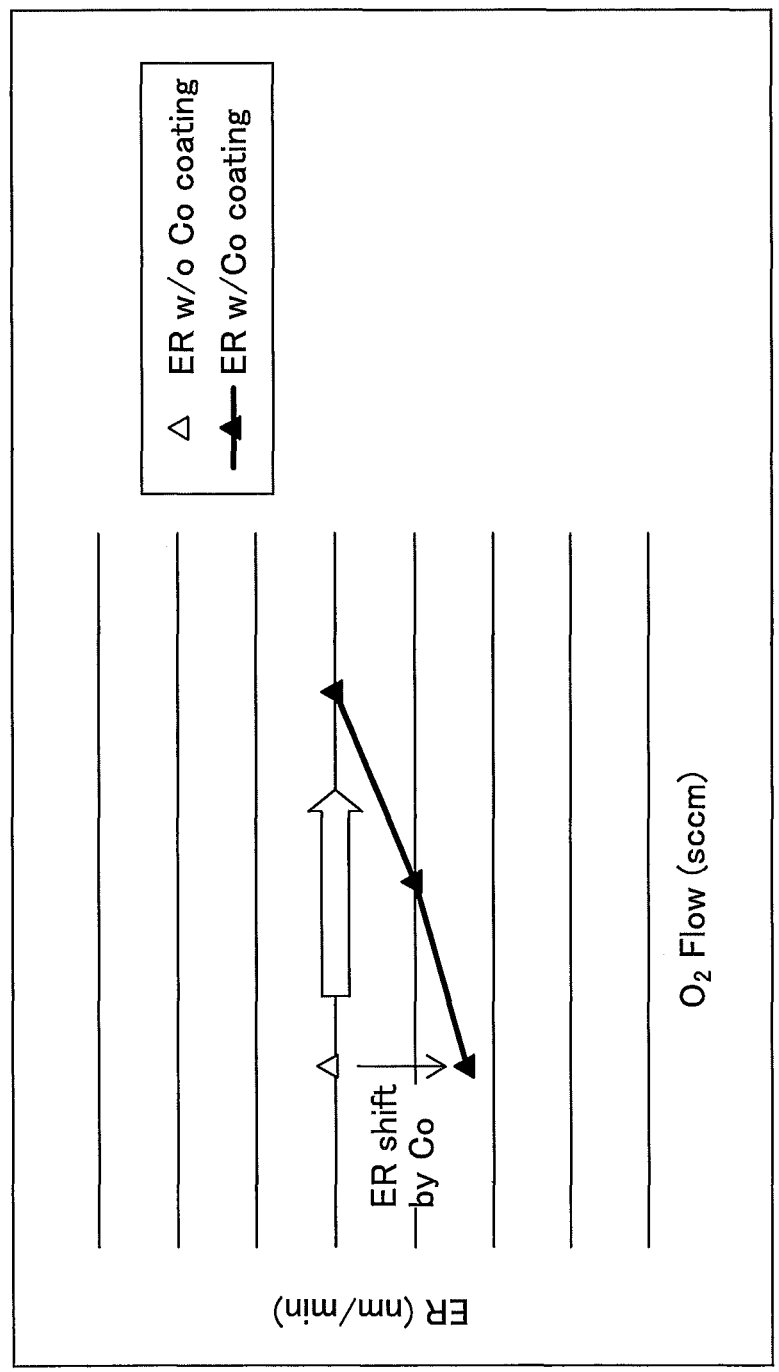
FIGS. 4A and 4B are graphs illustrating examples of differences of an ER in a case in which the cobalt coating layer is present and in a case in which the cobalt coating layer is not present.
Figure 4B:
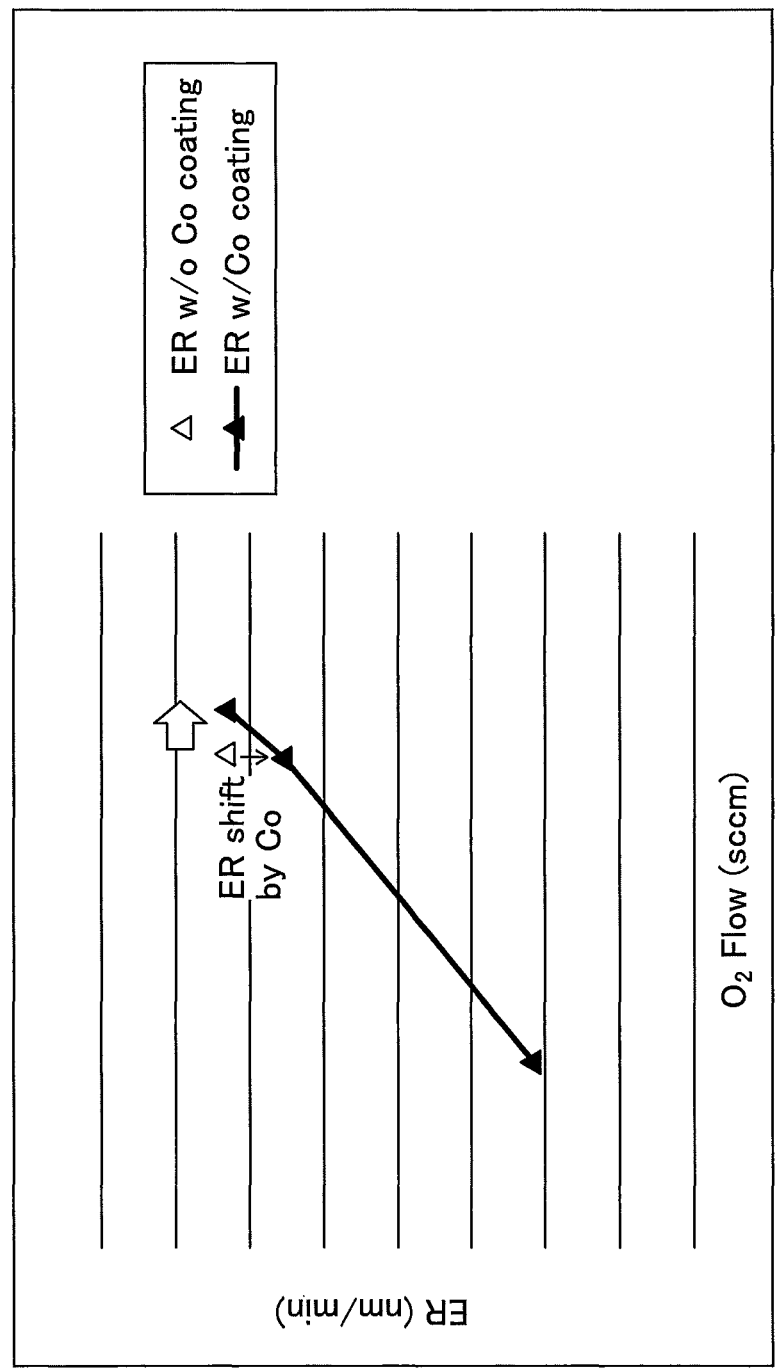

FIGS. 4A and 4B are graphs illustrating examples of differences of an ER in a case in which the top shield ring 41 is coated with the cobalt coating layer 42 and in a case in which the top shield ring 41 is not coated with the cobalt coating layer 42. FIG. 4A illustrates ERs obtained by performing a first type of plasma treatment based on a given recipe (1), under a case in which the top shield ring 41 is coated with the cobalt coating layer 42 and a case in which the top shield ring 41 is not coated with the cobalt coating layer 42. FIG. 4B illustrates ERs obtained by performing a second type of plasma treatment based on a given recipe (2), under a case in which the top shield ring 41 is coated with the cobalt coating layer 42 and a case in which the top shield ring 41 is not coated with the cobalt coating layer 42.

According to these graphs, in both FIGS. 4A and 4B, if oxygen gas supply rates are equal in both cases in which the top shield ring 41 is coated with the cobalt coating layer 42 and in which the top shield ring 41 is not coated with the cobalt coating layer 42, the ERs, which are obtained when the top shield ring 41 is coated with the cobalt coating layer 42, decrease, as compared to a case in which the top shield ring 41 is not coated with the cobalt coating layer 42. Also, in both FIGS. 4A and 4B, if oxygen gas supply rates increase, the obtained ERs increase. Therefore, the ER in a case in which the top shield ring 41 is coated with the cobalt coating layer 42 can be controlled to be equal to the ER in a case in which the top shield ring 41 is not coated with the cobalt coating layer 42, by controlling oxygen gas supply rates.

From the above, it was found that, by using a member such as the top shield ring 41, the quartz part 86 or the cover ring 89, having the cobalt coating layer 42 on a part of a surface of the member, because an amount of O radicals in plasma decreases, and an ER decreases, stable process characteristics (such as an ER) during plasma treatment can be obtained.

As described above, by a part of a surface of a replaceable member, used for the plasma processing apparatus 1 in the present embodiment, being coated with the cobalt coating layer 42, an ER can be decreased.

When a new plasma processing apparatus 1 is supplied (to a user), the member, such as the top shield ring 41, the quartz part 86, or the cover ring 89, is installed in a predetermined location in a state in which a part of the member is coated with the cobalt coating layer 42. Also, since the above mentioned members are consumables, the members are replaced. When the member is replaced, the member is replaced with a new member coated with the cobalt coating layer 42.

According to the present embodiment, when performing seasoning before processing a wafer W, just after the new plasma processing apparatus 1 is supplied or just after the above member is replaced, a condition inside the processing vessel 10 can be quickly changed into an adequate state in which stable process characteristics (such as an ER) can be obtained. Accordingly, because a time required for seasoning is lessened, throughput improves, and productivity also improves. Also, by optimizing a size and a location of a region to be coated with cobalt on a surface of the member, excessive decrease of the ER can be avoided, and a cobalt contamination in the processing vessel 10 can be controlled within an acceptable range.

It should be noted that a thickness of cobalt coated on a surface of the member is not relevant to the above described effect. Therefore, in order to shorten a time of coating process and to reduce cost, it is preferable that the thickness of cobalt coated on a surface of the member should be minimized to the extent possible.

Further, an example of a time to replace the above member (replacement cycle) includes a time for periodic maintenance, or a time to replace the focus ring 87.

In the above embodiment, a member and a plasma processing apparatus are described. However, a member and a plasma processing apparatus according to the present invention are not limited to the above embodiment. Various changes or enhancements can be made hereto within the scope of the present invention. Matters described in the above embodiments may be combined unless inconsistency occurs.

The plasma processing apparatus according to the present invention can be applicable to any types of plasma processing apparatuses, such as a capacitively coupled plasma (CCP) type, an inductively coupled plasma (ICP) type, a radial line slot antenna type, an electron cyclotron resonance plasma (ECR) type, and a helicon wave plasma (HWP) type.

In this specification, the semiconductor wafer W is referred to as an example of a substrate. However, the substrate processed by the plasma processing apparatus is not limited to the semiconductor wafer W. Examples of the substrate may include various types of substrates used in an LCD (Liquid Crystal Display) or a FPD (Flat Panel Display), a photomask, a CD substrate, and a printed circuit board.

What is claimed is:

1. A plasma processing apparatus comprising:
a processing vessel;

a mounting base disposed in the processing vessel;
an upper electrode provided at an upper part of the processing vessel;
a cylindrical first member provided around the upper electrode; and
a second member of a ring shape provided on a bottom surface of the first member, the second member being provided outside the mounting base in a radial direction;
wherein the plasma processing apparatus is configured to generate plasma from a gas in the processing vessel and to process a substrate disposed on the mounting base using the plasma, and
a part of a surface of the second member exposed to the plasma in the processing vessel is covered with a coating layer including cobalt.

2. The plasma processing apparatus according to claim 1, wherein the coating layer further includes carbon.

3. The plasma processing apparatus according to claim 1, wherein the coating layer is formed by thermal spraying.

4. The plasma processing apparatus according to claim 1, wherein the coating layer is formed by CVD (Chemical Vapor Deposition) or PVD (Physical Vapor Deposition).

5. The plasma processing apparatus according to claim 1, wherein the second member is formed of an insulating member and is replaceable.

6. The plasma processing apparatus according to claim 5, wherein the insulating member is quartz.

7. The plasma processing apparatus according to claim 1, wherein a part of an outer side surface of the second member is exposed to the plasma in the processing vessel and is covered with the coating layer.

8. The plasma processing apparatus according to claim 1, further comprising a third member of a ring shape provided at, an outer circumference of the mounting base.

9. The plasma processing apparatus according to claim 8, wherein at least a part of a side surface of the third member opposite from the mounting base is covered with the coating layer.

10. The plasma processing apparatus according to claim 1, wherein the plasma processing apparatus includes a focus ring disposed over the mounting base so as to surround an outer edge of the substrate, and the plasma processing apparatus further includes a fourth member of a ring shape provided at an outer circumference of the focus rime.

11. The plasma processing apparatus according to claim 10, wherein at least a pan of a side surface of the fourth member opposite from the mounting base is covered with the coating layer.

12. The plasma processing apparatus according to claim 1, wherein the coating layer consists of only cobalt.

* * * * *